United States Patent [19]

Fister et al.

[11] Patent Number: 4,872,047
[45] Date of Patent: Oct. 3, 1989

[54] SEMICONDUCTOR DIE ATTACH SYSTEM

[75] Inventors: Julius C. Fister, Hamden; Satyam C. Cherukuri, West Haven; Deepak Mahulikar, Meriden; Brian E. O'Donnelly, Branford, all of Conn.

[73] Assignee: Olin Corporation, New Haven, Conn.

[21] Appl. No.: 928,121

[22] Filed: Nov. 7, 1986

[51] Int. Cl.[4] .................... H01L 23/12; H01L 23/14
[52] U.S. Cl. ........................................ 357/67; 357/80; 357/74
[58] Field of Search ............... 357/74, 80, 73, 67; 174/52 FP

[56] References Cited

U.S. PATENT DOCUMENTS

| | | |
|---|---|---|
| 2,763,822 | 5/1955 | Frola et al. . |
| 2,922,092 | 1/1960 | Gazzara et al. . |
| 2,971,251 | 2/1961 | Willemse . |
| 3,159,462 | 12/1964 | Kadelburg . |
| 3,160,798 | 12/1964 | Lootens et al. . |
| 3,221,219 | 11/1965 | Emeis et al. . |
| 3,331,996 | 7/1967 | Green . |
| 3,454,374 | 7/1969 | Domin . |
| 3,593,412 | 7/1971 | Foote . |
| 3,620,692 | 11/1971 | Franklin et al. . |
| 3,645,785 | 2/1972 | Hentzschel . |
| 3,729,820 | 5/1973 | Thochi et al. ............... 357/74 |
| 3,859,715 | 1/1975 | Duffek et al. . |
| 4,229,758 | 10/1980 | Ikari . |
| 4,352,120 | 9/1982 | Kurihara et al. ............... 357/80 |
| 4,480,261 | 10/1984 | Hatton et al. ............... 357/67 |
| 4,487,638 | 12/1984 | Hoge . |
| 4,515,898 | 5/1985 | Davis et al. . |
| 4,592,794 | 6/1986 | Davis et al. . |
| 4,594,770 | 6/1986 | Butt . |
| 4,610,934 | 9/1986 | Boecker et al. . |
| 4,656,499 | 4/1987 | Butt ........................... 357/73 |
| 4,714,952 | 12/1987 | Takekawa et al. . |

FOREIGN PATENT DOCUMENTS

| | | |
|---|---|---|
| 667024 | 7/1963 | Canada . |
| 676283 | 12/1963 | Canada . |
| 700474 | 12/1964 | Canada . |
| 707458 | 4/1965 | Canada . |
| 755785 | 3/1967 | Canada . |
| 904567 | 7/1972 | Canada . |
| 0194475 | 9/1986 | European Pat. Off. . |
| 391108 | 8/1965 | Fed. Rep. of Germany . |
| 54-22163 | 2/1979 | Japan . |
| 55-15235 | 2/1980 | Japan . |
| 56-114338 | 9/1981 | Japan . |
| 58-151036 | 9/1983 | Japan . |
| 59-107527 | 6/1984 | Japan . |
| 59-151437 | 8/1984 | Japan . |
| 60-41234 | 3/1985 | Japan . |
| 60-235430 | 11/1985 | Japan . |

OTHER PUBLICATIONS

"Die Bonding & Packaging Sealing Materials", by Singer in *Semiconductor International*, Dec. 1983.
"A New Metal System for Die Attachment" by Winder et al. in *Proc. Tech. Program—Annu. Int.*, Electron. Packag. Conf. 2ND, 1982, pp. 715–757.
"A Critical Review of VLSI Die–Attachment In High Reliability Application", by Shukla et al. in Solid State Technology, Jul. 1985.

*Primary Examiner*—Rolf Hille
*Assistant Examiner*—Sheila Clark
*Attorney, Agent, or Firm*—Gregory S. Rosenblatt; Paul Weinstein

[57] ABSTRACT

A semiconductor die attach system adapted for attaching a semiconductor die to a substrate is provided. A metallic buffer component is disposed between the substrate and the semiconductor die to withstand stresses created from thermal cycling of the substrate and the die. The metallic buffer component is sealed to the substrate with a layer of solder. The layer of solder is provided to dissipate stresses created by thermal cycling of the substrate and the die. The die is sealed to the buffer with a silver-glass adhesive.

21 Claims, 2 Drawing Sheets

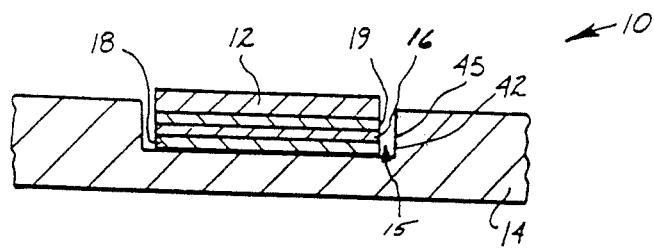
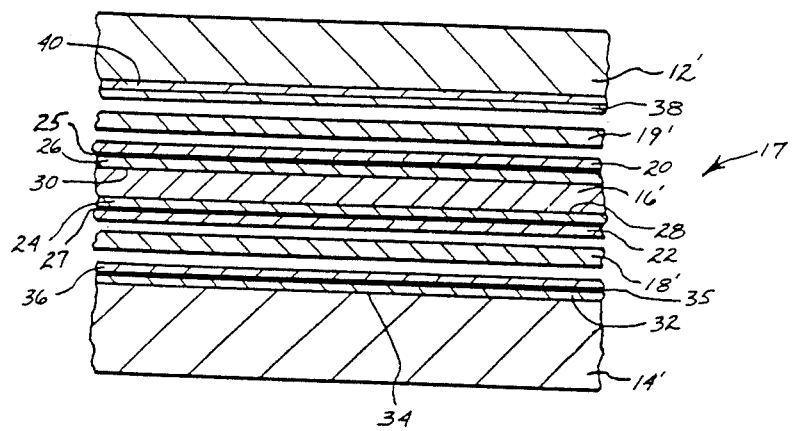
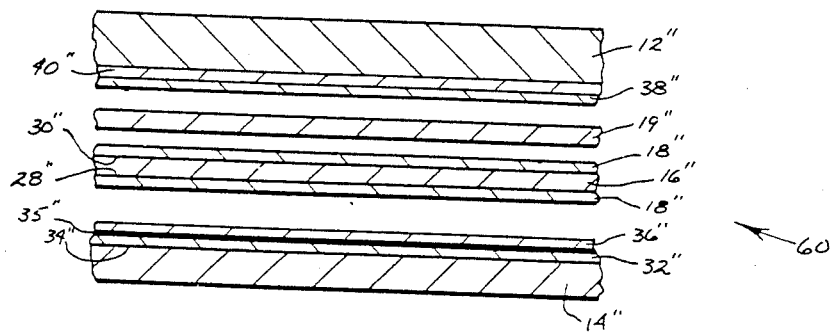
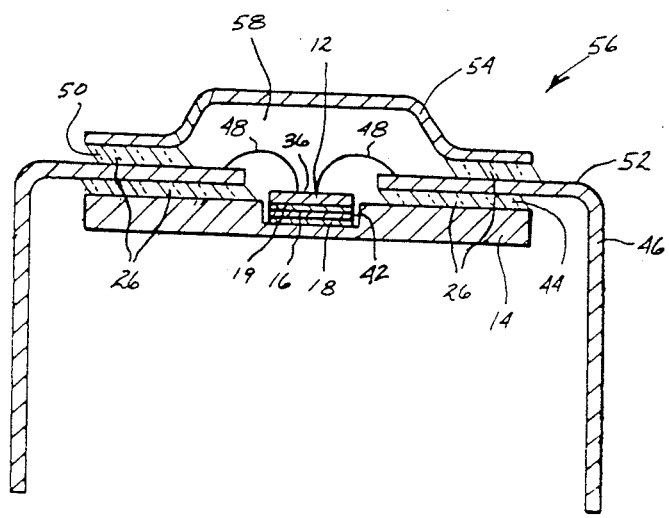

SEMICONDUCTOR DIE ATTACH SYSTEM

This application relates to U.S. patent application Ser. No. 826,808, entitled "SEMICONDUCTOR DIE ATTACH SYSTEM", by Michael J. Pryor et al., which in turn is a continuation-in-part of U.S. patent application Ser. No. 740,789, entitled "SEMICONDUCTOR DIE ATTACH SYSTEM", by Michael J. Pryor et al., which in turn is a continuation-in-part of U.S. patent application Ser. No. 711,868, entitled "SEMICONDUCTOR DIE ATTACH SYSTEM", by Michael J. Pryor et al.; European Patent Application Publication No. 0194475 entitled "SEMICONDUCTOR DIE ATTACH SYSTEM", BY MICHAEL J. PRYOR ET AL.; and U.S. Pat. No. 4,704,626, entitled "GRADED SEALING SYSTEMS FOR SEMICONDUCTOR PACKAGE", by D. Mahulikar et al.

While the invention is subject to a wide range of applications, it is particularly suited for semiconductor die attachment adapted for hermetically sealed packages and will be particularly described in that connection. More specifically, a metallic buffer component is disposed between and bonded with a solder and a silver-glass to a substrate and a semiconductor die, respectively, to dissipate thermal or mechanical stresses caused by thermal exposure. In another embodiment, a solder bonds the die to a substrate.

Semiconductor dies are typically attached to hermetically sealed packages with a bonding composition of various metals. These bonding compositions usually melt at a relatively high temperature in order to withstand the processing temperatures required to hermetically seal a package, i.e. above 400° C. Typical bonding materials and techniques are disclosed in articles entitled "Die Bonding & Packaging Sealing Materials", by Singer in *Semiconductor International,* December 1983; "A New Metal System for Die Attachment" by Winder et al. in *Proc. Tech. Program - Annu. Int.,* Electron. Packag. Conf. 2ND, 1982, pages 715–727; and "A Critical Review of VLSI Die-Attachment In High Reliability Application", by Shukla et al. in Solid State Technology, July 1985. Also U.S. Pat. No. 3,593,412 discloses a unique attachment system.

In a typical assembly operation, a semiconductor die or integrated circuit is placed in a cavity of a base member containing the bonding composition. The base is then heated to melt the bonding composition and attach the die within the cavity of the base. Subsequently, the cavity is covered with a lid and heated to seal the lid to the base and form an hermetic enclosure for the die. Lid sealing temperatures are typically about 400° C. to about 450° C. Examples of this type of process are disclosed in U.S. Pat. Nos. 4,229,758 and 4,487,638.

When the base and lids of the hermetically sealed semiconductor packages are formed of metal, such as selected copper alloys, the semiconductor die, typically silicon, is directly attached to the metallic substrate. Unlike the low degree of mismatch between coefficients of thermal expansion (CTE) of the components and the die, which is common to the conventional ceramic packages, there is a very large mismatch between the coefficients of thermal expansion of the silicon and the metallic substrates, i.e. from about $100 \times 10^{-7}$ to about $130 \times 10^{-7}$ in/in/°C. By contrast, the mismatch between the coefficients of thermal expansion of alumina and silicon is only about $15 \times 10^{-7}$ in/in/°C.

The mismatch in the CTE results in the formation of large strains and resulting thermal stresses during thermal cycling. For example, when a silicon die is attached to a metal substrate with a conventional gold-2% silicon sealing metal, it is processed at a temperature of about 400° C. After the die is attached to the substrate, they are cooled down to room temperature. Very often, thermal stress is generated during this cool down cycle by the large mismatch in the CTE of the die and substrate. The stress and strain may cause the die to either crack or separate at the interface from the substrate.

U.S. Pat. No. 2,971,251 to Willemse discloses a semiconductor device soldered to a carrier or supporting plate having a matched coefficient of thermal expansion with that of the semiconductor device. The plate may be soldered to a copper cooling plate having a coefficient of thermal expansion which is significantly different from that of the plate and semiconductor device. The solder is silver, although if the bottom side of the carrier plate is gold plated, different soldering agents may be employed. The carrier plate also has a thin layer of gold on its top surface to enhance the adhesion to a tin solder which is bonded between the carrier plate and the silicon chip. One embodiment of the present invention differs from the patent in that it discloses bonding a chip to a substrate with an intermediate buffer to compensate for the mismatch of coefficient of thermal expansion between the die and the substrate. The invention includes specifying the specific bonding materials used between the die and the buffer as well as between the buffer and the substrate. Further, barrier layers and oxidation resistant layers are disposed on the various components to enhance the bond strength and prevent the disbonding of the chip from factors such as oxidation, nonbonding impurities on the surfaces, formation of brittle intermetallic phases, solder fatigue, creep rupture and extensive voiding under the die.

U.S. patent application Ser. No. 826,808 to Pryor et al. also addresses the need to dissipate stresses from thermal cycling of packages with large coefficient of thermal expansion differences between the die and the spaced substrate. The Pryor et al. application discloses a buffer bonded to a substrate and a die with solders containing tin. Although tin containing solders, as disclosed in the patent application to Pryor et al., perform adequately, intermetallic compounds may form in the presence of gold and reduce the thermal cycling capability or lower the cohesion of the die with the base.

It is a problem underlying the present invention to provide a semiconductor die attachment system for attaching a semiconductor die to a substrate which is able to withstand the stresses resulting from thermal cycling of the substrate having an attached die.

It is an advantage of the present invention to provide a semiconductor die attach system and process of attaching the system which obviates one or more of the limitations and disadvantages of the described prior arrangements.

It is a further advantage of the present invention to provide a semiconductor die attach system and process of attaching the system which is able to dissipate thermal stresses formed between a semiconductor die and a substrate.

It is a yet further advantage of the present invention to provide a semiconductor die attach system and process of attaching the system wherein a layer of solder disposed between a semiconductor die and a substrate provides a stress relaxation path to dissipate thermal stresses.

It is still another advantage of the present invention to provide a semiconductor die attach system and process of attaching the system including a buffer component being bonded to a substrate with a solder and to a die with a sealing glass.

Accordingly, there has been provided a semiconductor die attach system and process of attaching the system adapted for attaching a semiconductor die to a substrate having a relatively high CTE. A metallic buffer component is disposed between the substrate and the semiconductor die to withstand stresses created by thermal cycling of the substrate and the die. The metallic buffer component is preferably sealed to the substrate with a layer of solder. The layer of solder is provided to dissipate stresses created by thermal cycling of the substrate and the die. Oxidation resistant layers and barrier layers may be disposed on the surfaces of the substrate and the buffer to enhance the bonding strength. The buffer component is bonded to the die with a silver-glass adhesive. In a second embodiment, the buffer has a coating of solder. In a third embodiment, the solder is used without a buffer to attach the die to the substrate.

The invention and further developments of the invention are now elucidated by means of the preferred embodiments in the drawings.

IN THE DRAWINGS

FIG. 1 illustrates a semiconductor die attach system including a buffer layer bonded to a substrate with a layer of solder and to a semiconductor die with a silver-glass adhesive in accordance with the present invention.

FIG. 2 illustrates a semiconductor die attach system incorporating barrier layers and oxidation resistant layers on the die, buffer layer and the substrate.

FIG. 3 illustrates a glass-sealed, semiconductor package incorporating a die attach system in accordance with the present invention.

FIG. 4 illustrates a second embodiment of a semiconductor die attach system incorporating a buffer layer coated with a layer of solder.

Figure 5:
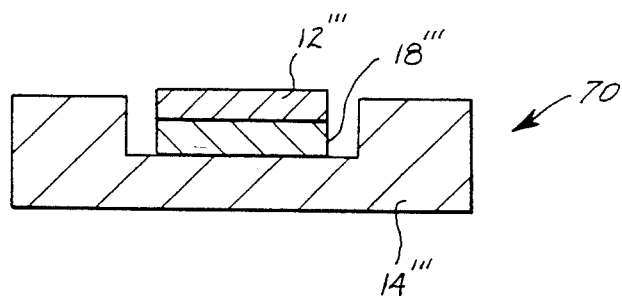
FIG. 5 illustrates a third embodiment of a semiconductor die attach system using a solder to bond the die to a substrate.

A semiconductor die attach system 10 for attaching a semiconductor die 12 to a high conductivity substrate 14 is illustrated in FIG. 1. A buffer component 16 is disposed between and bonded to the substrate 14 and the die 12 for withstanding thermal stress generated from thermal cycling of the substrate and the die. A layer of solder 18, preferably selected from the group consisting of gold-silicon, gold-tin, copper-indium, silver-tin, silver-antimony-tin, lead-indium-tin, lead-indium-silver-tin, lead-indium-silver, and mixtures thereof, bonds the buffer component to the substrate 14 for dissipating thermal stress generated from thermal cycling of the substrate 14 and the die 12. A silver-glass adhesive 19 bonds the buffer component 16 to the semiconductor die 12.

The present invention is primarily directed to forming a semiconductor package wherein the substrate or base is formed of a material having a relatively high coefficient of thermal expansion (CTE), i.e. above about $160 \times 10^{-7}$ in/in/°C. The semiconductor die to be attached to the substrate typically has a much lower coefficient of thermal expansion of about $50 \times 10^{-7}$ in/in/°C. As disclosed in U.S. patent application Ser. No. 826,808, it has been found that the semiconductor die may be attached to the substrate with a sealing or bonding material selected from the group consisting of gold-silicon, silver-tin, copper-indium, gold-tin, silver-antimony-tin and mixtures thereof. Moreover, these materials may be used to bond a buffer component to both a die and a substrate. The solder has certain limitations in bonding to a die relating to the metallurgy. The solder can bond to a die having a silver plating. However, many dies do not have silver plated backs. The solder can also be bonded to gold plated backs, if the gold plating is thick enough. Finally, the solder cannot form an adequate bond to a bare backed die.

The present invention is directed to disposing a metallic or non-metallic buffer component 16 between substrate 14 with a high CTE and a semiconductor die 12 with a relatively low CTE. The buffer 16 can be bonded to the substrate 14 with a solder 18 and to the die with a silver-glass adhesive 19. The solder 18 is provided to dissipate the thermal stresses caused by the strains generated by exposure of the die 12 and substrate 14 to thermal cycling. This may occur during the fabrication of a semiconductor package, as seen in FIG. 3, when the die 12 and the substrate 14 are cooled down to room temperature.

The buffer 16 is preferably formed of a thin strip of material capable of withstanding these stresses from thermal cycling. The buffer component 16 preferably has a coefficient of thermal expansion which is more closely matched to the die 12 than to the substrate 14. As the die attach system 15 begins to cool down, the strains caused by the mismatch in coefficients of thermal expansion occurs between the buffer 16 and the substrate 14 instead of between the buffer 16 and the die 12 whose coefficients of thermal expansion are more closely matched. One advantage of locating the larger differential in the coefficients of thermal expansion between the buffer 16 and the substrate 14 is that both the buffer 16 and the substrate 14 may be formed of a metallic material which is typically ductile and better able to withstand stresses and deformation. Still, it is important to reduce stresses and deformation between the buffer 16 and the die 12 because the semiconductor material, of which the die is formed, is usually very brittle and unable to withstand any significant deformation. In fact, any stresses between the brittle semiconductor material and the buffer 16 are likely to cause cracking of the semiconductor material or separation at the die-substrate interface.

Referring again to FIG. 1, a buffer component 16 is preferably selected from a controlled-expansion alloy having a thickness of from about 1 to about 20 mils. Preferably, the thickness of the buffer 16 is from about 2 to about 8 mils. It is advantageous for the buffer 16 to be relatively thin so as to reduce the thermal resistance between the semiconductor device 12 and the substrate 14. At the same time, the buffer component 16 is stiff, i.e. does not deflect, to prevent deformation during thermal cycling. Although, the buffer component 16 may deform to compensate for the strains generated during the cool down period after die attachment or package fabrication, this deformation is thought to be slight and does not significantly effect the operation of the semiconductor device as long as it neither cracks nor separates at its interface with the buffer component.

The buffer component 16 also has a coefficient of thermal expansion from about $35 \times 10^{-7}$ to about $100 \times 10^{-7}$ in/in/°C. Preferably, the buffer component 16 has a CTE of about $40 \times 10^{-7}$ to about $80 \times 10^{-7}$ in/in/°C. In general, it is desirable that the coefficient of thermal expansion of the buffer component 16 be compatible and relatively close to the CTE of the semiconductor die 12. The buffer component 16 may be constructed of a material having a relatively low CTE selected from the group consisting of tungsten, rhenium, molybdenum and alloys thereof, and nickel-iron alloys, cermets and ceramics. Several examples of particular nickel-iron alloys include 42 Ni-58 Fe, 64 Fe-36 Ni and 54 Fe-28 Ni-18 Co. It is also within the terms of the present invention to form the buffer component 16 of any metal, alloy, ceramic or cermet which is able to meet the requirement for a suitable coefficient of thermal expansion as set out hereinbefore.

The die attach system 17 illustrated in FIG. 2 is similar to that shown in FIG. 1 but includes oxidation resistant layers, barrier layers and intermediate layers. First and second oxidation resistant layers 20 and 22 may be disposed on opposite surfaces of buffer component 16' to enhance the strength of the seal with the silver-glass adhesive 19' and the layer of solder 18'. To prevent oxidation of the buffer component 16', it may be desirable to provide first and second barrier layers 26 and 24 on surfaces 30 and 28, respectively, of the buffer component 16'. Throughout the specification, primed, double and triple primed reference numerals indicate components which are substantially the same as the components identified by the same unprimed reference numerals.

The first and second barrier layers 26 and 24 are typically formed of a material from the group consisting of nickel, cobalt and alloys thereof. However, it is also within the terms of present invention to form the first and second barrier layers 26 and 24 of any suitable metal or alloy which prevents interdiffusion between the buffer component 16' and the first and second oxidation resistant layers 20 and 22 as will later be described herein. The first and second barrier layers 26 and 24 also enhance the bonding of the first and second oxidation resistant layers 20 and 22, described herein, to the buffer component 16'. The first and second barrier layers 26 and 24 are applied by any conventional means such as electroplating to thickness of about 1 to about 10 microns. Preferably, the thickness of the barrier layers are from about 1.2 to about 5 microns.

Oxidation resistant layers 20 and 22 are preferably formed on the barrier layers 26 and 24, respectively. The oxidation resistant layers are typically formed of a material selected from the group consisting of gold, silver, palladium, platinum and alloys thereof. These metals are particularly selected for their ability to resist oxidation at the high sealing temperatures to which they will be subjected. Typically they are plated onto the first and second barrier layers 26 and 24 at a thickness of about 1 to about 10 microns. Preferably, the thickness of the oxidation resistant layers 20 and 22 is from about 1.2 to about 5 microns. It is also within the scope of the present invention to plate oxidation resistant layers 20 and 22 directly onto the buffer component 16' without an intermediate barrier layer.

First and second intermediate layers 25 and 27 may be disposed between the first and second oxidation resistant layers 20 and 22 and the first and second barrier layers 26 and 24, respectively. The intermediate layers 25 and 27 are preferably formed of a gold flashing for preventing diffusion of oxygen through the oxidation resistant layers into the barrier layers at elevated temperatures. Oxygen diffusion may form oxides of the barrier layer material which reduces adhesion of the barrier and oxidation resistant layers. The gold flashing is preferably from about 0.1 to about 0.2 microns in thickness.

The substrate 14' may be formed of a high coefficient of thermal expansion material selected from the group consisting of metals, alloys, ceramics and cermets. The substrate material has a coefficient of thermal expansion of more than about $140 \times 10^{-7}$ in/in/° C. and preferably more than about $160 \times 10^{-7}$ in/in/°C. As with the buffer component 16', it may be desirable to form a third barrier layer 32 on the surface 34 of the substrate 14'. Further, a third oxidation resistant layer 36 may be formed on the barrier layer 32. If appropriate, a third intermediate layer 35 may be disposed between the barrier layer 32 and the oxidation resistant layer 36. The third intermediate layer may be a gold flash which serves the same function as the first and second intermediate layers 25 and 27.

The solder 18', disposed between the substrate 14' and the buffer 16', is relatively soft and deforms at a relatively low stress to accommodate the stress and strain generated by the mismatch in coefficients of thermal expansion of the buffer 16' and the substrate 14'. The solder 18' also distances the buffer 16' and the die 12' from the high coefficient of thermal expansion substrate 14' so as to decrease the effect of the mismatch in coefficient of thermal expansion between the die 12' and the substrate 14'. The solder 18' is preferably selected from the group consisting of gold-silicon, gold-tin, silver-tin, silver-antimony-tin, lead-indium-silver-tin, copper-indium, lead-indium-tin, lead-indium-silver and mixtures thereof. The solder 18' is preferably the lead-indium-silver solder constituted of from about 15 to about 95 wt. % lead, from about 1 to about 80 wt. % indium and the remainder essentially silver. Preferentially, the lead-indium-silver solder comprises from about 85 to about 94 wt. % lead, from about 1 to about 5 wt. % indium and the remainder essentially silver. The solder 18' and in particular the lead-indium-silver solders have a low flow stress i.e. are "soft". For example, a 92.86Pb-4.76In-2.38Ag solder has a flow stress of about 4560 pounds per square inch (psi). This compares with a gold-2% silicon solder having a flow stress of about 43,500 psi. With a lower flow stress, the solder is more pliable and more able to absorb the stresses generated by the mismatch in coefficients of thermal expansion between the die 12' and the substrate 14'. Another solder which may be used has a composition of 92.5Pb-5In-2.58Ag. The solders containing tin have been found more effective in environments which do not have any gold.

A silver-glass adhesive 19' seals the semiconductor die 12' to the buffer 16'. A suitable silver-glass adhesive 19' may be one of the Amicon series of silver-glass conductor materials manufactured by Amicon-A Grace Company. Another operable appropriate silver-glass adhesive is one of the silver-glass conductor materials manufactured by Johnson Matthey, Inc. The silver-glass adhesives 19' contain a binder, a glass, silver particles, and a solvent. To apply adhesives 19', they are first spread, as a paste, on the surface of the buffer 16'. The die 12' is then placed on the glass covered buffer surface. Then, the system is heated to a curing temperature i.e. about 140° C. to drive off the volatiles and coalesce the silver-glass adhesive 19' to adhere to the buffer 16' and the die 12'. A weak or tenuous bond is formed at this stage. The glass is next fired at a temperature, i.e. about 420° C. and for an appropriate time so as to provide glass melting, flow, wetting and formation of a 100% inorganic, silver-glass bond between the die 12' and the buffer 16'. The specific time and temperature for the firing is dependent upon the size of the die and the particular silver-glass system used.

The semiconductor die 12' is typically formed of a material selected from the group consisting of silicon, gallium arsenide, silicon carbide and combinations thereof. The silver-glass adhesive 19' has been found to form a superior bond with bare-back dies because of the presence of a thick oxide layer. However, in many instances, dies are manufactured with an oxidation resistant layer 38, selected from the materials used to form the oxidation resistant layers, 26 and 28 on the buffer component 16'. In addition, a barrier layer 40 may be disposed between the semiconductor die 12' and the oxidation resistant layer 38 as appropriate. The silver-glass adhesive 19' has been found to effectively bond to oxidation resistant layers, such as gold or silver. It is, however, within the terms of the present invention, to use die 12' with or without an oxidation layer 38 and with or without a barrier layer 40.

To further understand the present invention, an explanation of the process by which the semiconductor die 12 is attached to the buffer component 16 and substrate 14 is provided herein with reference to FIGS. 1 and 3. A solder, preform 18, preferably a lead-indium-silver solder, is disposed in a cavity 42 of a substrate 14. Then, a buffer 16 is stacked on top of the solder preform 18. The substrate 14 may then be placed on a hot stage and heated to a temperature of at least about the melting point of the solder or to about 100° C. in excess thereof. This heating is preferably done in an inert atmosphere of gases, such as, for example, nitrogen, argon, forming gas, nitrogen-4% hydrogen and neon to protect against oxidation. The buffer 16 is preferably scrubbed against the molten solder 18 so as to level the solder, break any oxide films and improve the intimate contact between the buffer 16, the solder 18 and the substrate 14. The assembly of the substrate 14, solder 18 and buffer 16 is then allowed to cool to room temperature. A layer of silver-glass adhesive 19 is next disposed on a surface of the buffer 16. Then, a die 12 is stacked on the silver-glass adhesive. The substrate 14, buffer 16, die 12 and the adhesive 19 are next heated to a temperature so as to volatilize the solvents and binders of the adhesive and drive them off. At the same time, the glass coalesces to form a weak or tenuous bond between the die 12 and the buffer 16. Finally, the entire assembly 15 including the substrate 14 and the die 12 may be fired at a temperature necessary for glass melting, flow, wetting and formation of a silver-glass inorganic bond between the die 12 and the buffer 16.

Although the process of constructing semiconductor package 56 has been described in reference to the die attach system 15, as shown in FIG. 1, it is also within the terms of the present invention to substitute the die attach system 17, in FIG. 3, for the system 15. Moreover, in applying the die attach system 17, any of the oxidation resistant layers, intermediate layers or barrier layers may be used as appropriate.

At this stage, the semiconductor package 56 can be completed. First, a preform of sealing glass, such as one selected from the group consisting essentially of lead-borate, lead-zinc-borate, lead-borosilicate and lead-zinc-borosilicate mixed with a particulate additive as disclosed in U.S. patent application Ser. No. 888,316, may be disposed on the substrate 14. Then, a leadframe 46 is placed on the glass 44. The substrate 14, glass 44 and leadframe 46 are heated to a temperature so as to melt glass 44 and cause the leadframe 46 to sink into the glass. If desired, the firing of the glass adhesive 19 can be incorporated with this step. After cool down, the die 12 is electrically connected to the ends of the leadframe 46 by any conventional technique, such as wire bonding with wires 48. A preform of glass 50, which may be the same as glass 44, may then be disposed on the surface 52 of the leadframe 46. A cap or lid 54 is then stacked on the glass 50 and the resulting semiconductor package 56 is heated so as to melt glass 50 and hermetically seal the die 12 within the enclosure 58 of the semiconductor package 56.

Although the invention preferably includes a solder component 18 between the substrate 14 and the buffer 16, it is also within the terms of the present invention to eliminate the solder component 18 and spot weld the buffer component 16 directly to the substrate 14. This may be accomplished by applying heat and pressure for the necessary time to achieve a degree of melting sufficient to attain solid state diffusion to bond the buffer component 16 directly to the substrate 14. This may further be accomplished without oxidation resistant or barrier layers between the buffer component and the substrate. An embodiment of this scope would be similar to that illustrated in FIG. 1 but without the solder layer 18.

In a further embodiment, as illustrated in FIG. 4, a semiconductor die attach system 60 differs from the semiconductor die attach system 17 illustrated in FIG. 2 in the construction of the buffer 16''. The buffer 16'' may be coated with solder 18'', preferably the lead-indium-silver solder by any conventional technique such as hot dipping. Since the dipping process may immediately follow the cleaning of the buffer, both the oxidation resistant layers and the barrier layer can be eliminated. The buffer 16'' can be directly bonded to the substrate 14''. As disclosed hereinbefore, the substrate 14'' may, if appropriate, include a third barrier layer 32'', a third intermediate layer 35'' and a third oxidation resistant layer 36''. The solder coating 18'' also bonds to the silver-glass adhesive 19''. The bonding strength is thought to be increased when both the silver-glass adhesive 19'' and the solder coating 18'' contain a silver constituent.

The process of attaching the semiconductor die 12'' to a substrate 14'', as illustrated in FIG. 4, may include the following sequence of steps. First, the buffer 16'' having a solder coating 18'', preferably lead-indium-silver, is disposed on a substrate 14'' which may have a third barrier layer 32'', a third intermediate layer 35'' and a oxidation resistant layer 36''. Any or all of the layers on the substrate 14'' may be deleted as appropriate. The stacked substrate 14'' and buffer 16'' may be heated on a hot stage to a temperature wherein the solder melts so that upon cooling to room temperature, it bonds the buffer 16'' onto the surface of the substrate 14''. Then, a layer of silver-glass adhesive 19''', in paste form, may be spread on the surface of the buffer 16''. The die 12'', which may be provided with an oxidation resistant layer 38'' and a barrier layer 40'', if appropriate, is then stacked on the glass adhesive 19'''. The assembly is then heated to a temperature required to drive off the volatiles and coalesce the silver-glass adhesive 19″ and form a weak or tenuous bond to the die 12″ and to the solder coated surface of the buffer 16″. The assembly 60, including the substrate 14″, the buffer 16″, the adhesive 19″ and the die 12″, is heated to the firing temperature for the time required to melt the glass adhesive 19″. Then, the assembly 60 is cooled down so that the die is affixed to the buffer 16″. As with the die attach assemblies 15 and 17, die attach assembly 60 may be incorporated in a semiconductor package as, for example, the type illustrated in FIG. 3. The firing of the glass adhesive may be incorporated with the melting of glass used in sealing the semiconductor package.

In another embodiment, as illustrated in FIG. 5, a die attach assembly 70 includes a substrate 14‴, a solder component 18‴ and a die 12‴. The die 12‴ preferably has an oxidation resistant coating on the surface bonded to the solder 18‴. The coating may be selected from any desirable material, such as gold or silver. The buffer component of the earlier described embodiments is deleted and the semiconductor die 12‴ is bonded to the substrate 14‴ with only a solder 18‴. It is thought that the solder component alone, if compliant enough to withstand thermal shock testing, can adequate dissipate thermal stress generated from thermal cycling. The solder component 18‴ is selected from the group consisting of lead-indium-silver, lead-indium-silver-tin, and mixtures thereof. The solder is preferably a lead-indium-silver comprising from about 15 to about 95 wt. % lead, from about 1 to about 80 wt. indium and the remainder essentially silver. More preferably, the lead-indium-silver solder comprises from about 85 to about 94 wt. % lead, from about 1 to about 5 wt. % indium and the remainder essentially silver. An important characteristic of the solder 18‴ is that the flow stress is low and able to absorb the stresses caused by the mismatch between the coefficients of thermal expansion of the die 12‴ and the substrate 14‴. The solder layer 18‴ preferably has a thickness of between about 1 to about 15 mils. A solder consisting of about 92.86Pb-4.76In-2.38Ag has a flow stress of about 4,560 psi. This solder is particularly useful in atmospheres where gold is present such as a die 12‴ having a gold backing. The lead-indium-silver solder does not form any substantial intermetallic compounds in the presence of gold to reduce the thermal cycling capability of the structure 70 or to lower the cohesion of the die 12‴ with the substrate 14‴.

The patents, applications and publications set forth in this application are each intended to be incorporated in their entirety by reference herein.

It is apparent that there has been provided in accordance with the present invention a semiconductor die attach system and process of using the system which fully satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A semiconductor die attach system adapted for attaching a semiconductor die to a substrate, comprising:
    a substrate;
    a semiconductor die;
    a buffer component disposed between and bonded to said substrate and said semiconductor die for withstanding thermal stress generated from thermal cycling of said substrate and die, said buffer having a coefficient of thermal expansion of from about $35 \times 10^{-7}$ to about $100 \times 10^{-7}$ in/in/°C.;
    a layer of solder bonding said buffer component to said substrate, said layer of solder for dissipating thermal stress generated from thermal cycling of said substrate and die, said solder being selected from the group consisting of gold-silicon, gold-tin, copper-indium, silver-antimony-tin, lead-indium-tin, lead-indium-silver, lead-indium-silver-tin and mixtures thereof; and
    a silver-glass adhesive bonding said buffer component to said die.

2. The die attach system of claim 1 wherein said solder is lead-indium-silver, said lead-indium-silver solder comprising from about 15 to about 95 wt. percent lead, from about 1 to about 80 wt. percent indium and the remainder essentially silver.

3. The die attach system of claim 2 wherein said lead-indium-silver solder comprises from about 85 to about 94 wt. percent lead, from about 1 to about 5 wt. percent indium and the remainder essentially silver.

4. The die attach system of claim 2 further including first and second oxidation resistant layers disposed on opposite bonding surfaces of said buffer component, said first and second oxidation resistant layers being selected from the group consisting of gold, silver, palladium, platinum and alloys thereof.

5. The die attach system of claim 4 further including first and second barrier layers disposed between said first and second oxidation resistant layers, respectively, and said buffer component, said first and second barrier layers being selected from the group consisting of nickel, cobalt and alloys thereof.

6. The die attach system of claim 5 further including first and second intermediate layers to resist oxidation of said first and second barrier layers, said first and second intermediate layers being formed of gold flashing.

7. The die attach system of claim 5 wherein said substrate has a third oxidation resistant layer on the surface adapted to have the lead-indium-silver solder attached thereto, said third oxidation resistant layer being of a material selected from the group consisting gold, silver, palladium, platinum and alloys thereof.

8. The die attach system of claim 7 further including a third barrier layer between said third oxidation resistant layer and said substrate, said third barrier layer being of a material selected from the group consisting of nickel, cobalt and alloys thereof.

9. The die attach system of claim 8 further including a third intermediate layer disposed between said third barrier layer and said third oxidation resistant layer, said third intermediate layer to resist oxidation of said third barrier layer, said third intermediate layer being formed of a gold flashing.

10. The die attach system of claim 8 wherein said buffer component is constructed of a material selected from the group consisting of tungsten, rhenium, molybdenum, alloys thereof, nickel-iron alloys, cermets and ceramics.

11. The die attach system of claim 10 wherein said substrate has a coefficient of thermal expansion of more than about $140 \times 10^{-7}$ in/in/°C., said substrate being a material selected from the group consisting of metals, alloys, ceramics and cermets.

12. The die attach system of claim 11 further including
a cap;
a leadframe disposed between said substrate and said cap; and
a sealing glass bonding said leadframe to said cap and said substrate to form a hermetically sealed package.

13. A semiconductor die attach system adapted for attaching a semiconductor die to a substrate, comprising:
a substrate;
a semiconductor die
a buffer component having a coefficient of thermal expansion of from about $35 \times 10^{-7}$ to about $100 \times 10^{-7}$ in/in/°C. and disposed between and bonded to said substrate and said semiconductor die for withstanding thermal stress generated from thermal cycling of said substrate and die, said buffer component having a coating of solder, said coating of solder for dissipating thermal stress generated from thermal cycling of said substrate and said die, said solder being selected from the group consisting of gold-silicon, gold-tin, silver-tin, silver-antimony-tin, lead-indium-tin, copper-indium, lead-indium-silver, lead-indium-silver-tin and mixtures therof, said solder bonding said buffer component to said substrate; and
a silver-glass adhesive bonding said solder coating on said buffer component and to said die.

14. The die attach system of claim 13 including said solder being said lead-indium-silver solder, said lead-indium-silver solder comprising from about 15 to about 95 wt. percent lead, from about 1 to about 80 wt. percent indium and the remainder essentially silver.

15. The die attach system of claim 14 wherein said lead-indium-silver solder comprises from about 10 to about 90 wt. percent lead, from about 10 to about 20 wt. percent indium and the remainder essentially silver.

16. The die attach system of claim 14 wherein said substrate has a third oxidation resistant layer on the surface adapted to have the lead-indium-silver solder attached thereto, said third oxidation resistant layer being of a material selected from the group consisting gold, silver, palladium, platinum and alloys thereof.

17. The die attach system of claim 16 further including a third barrier layer between said third oxidation resistant layer and said substrate, said third barrier layer being of a material selected from the group consisting of nickel, cobalt and alloys thereof.

18. The die attach system of claim 17 further including a third intermediate layer disposed between said third barrier layer and said third oxidation resistant layer, said third intermediate layer to resist oxidation of said third barrier layer, said third intermediate layer being formed of a gold flashing.

19. The die attach system of claim 17 wherein said buffer component is constructed of a material selected from the group consisting of tungsten, rhenium, molybdenum, alloys thereof, nickel-iron alloys, cermets and ceramics.

20. The die attach system of claim 19 wherein said substrate has a coefficient of thermal expansion of more than about $140 \times 10^{-7}$ in/in/°C., said substrate being a material selected from the group consisting of metals, alloys, ceramics and cermets.

21. The die attach system of claim 20 further including:
a cap;
a leadframe disposed between said substrate and said cap; and
a sealing glass bonding said leadframe to said cap and said substrate to form a hermetically sealed package.

* * * * *